(12) United States Patent
Eikyu et al.

(10) Patent No.: US 10,121,894 B2
(45) Date of Patent: Nov. 6, 2018

(54) SEMICONDUCTOR DEVICE AND METHOD OF MANUFACTURING THE SAME

(71) Applicant: RENESAS ELECTRONICS CORPORATION, Tokyo (JP)

(72) Inventors: Katsumi Eikyu, Tokyo (JP); Atsushi Sakai, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/649,984

(22) Filed: Jul. 14, 2017

(65) Prior Publication Data
US 2018/0026134 A1    Jan. 25, 2018

(30) Foreign Application Priority Data
Jul. 20, 2016  (JP) ................... 2016-142524

(51) Int. Cl.
  *H01L 29/66* (2006.01)
  *H01L 29/78* (2006.01)
  *H01L 21/28* (2006.01)
  *H01L 29/08* (2006.01)
  *H01L 29/423* (2006.01)
  *H01L 29/10* (2006.01)

(52) U.S. Cl.
  CPC .... *H01L 29/7835* (2013.01); *H01L 21/28061* (2013.01); *H01L 29/0847* (2013.01); *H01L 29/1033* (2013.01); *H01L 29/4236* (2013.01); *H01L 29/4238* (2013.01); *H01L 29/42312* (2013.01)

(58) Field of Classification Search
  CPC ............. H01L 29/7835; H01L 29/0847; H01L 29/1033; H01L 29/42312; H01L 29/4236; H01L 29/4238; H01L 21/28061
  USPC ........................................... 257/330
  See application file for complete search history.

(56) References Cited

U.S. PATENT DOCUMENTS

2008/0246080 A1* 10/2008 Ito .................... H01L 29/0865
                                                                257/328

FOREIGN PATENT DOCUMENTS

JP             2014-107302 A     6/2014

* cited by examiner

*Primary Examiner* — Tu-Tu Ho
(74) *Attorney, Agent, or Firm* — McDermot Will & Emery LLP

(57) ABSTRACT

In an LDMOS having an element isolation region of an STI structure, there is prevented an occurrence of insulation breakdown which might be caused when electrons generated in a semiconductor substrate near an edge portion of a bottom face of the element isolation region are poured into a gate electrode. Immediately over an upper surface of an offset region adjacent to the element isolation region embedded in a main surface of the semiconductor substrate between a source region and a drain region, there is provided a trench penetrating a silicon film forming the gate electrode. As a consequence, the silicon film and a metal film for filling the trench form the gate electrode.

15 Claims, 10 Drawing Sheets

_US 10,121,894 B2_

SEMICONDUCTOR DEVICE AND METHOD OF MANUFACTURING THE SAME

CROSS-REFERENCE TO RELATED APPLICATIONS

The disclosure of Japanese Patent Application No. 2016-142524 filed on Jul. 20, 2016 including the specification, drawings and abstract is incorporated herein by reference in its entirety.

BACKGROUND

The present invention relates to a semiconductor device and a method of manufacturing the same and is, for example, suitably applicable to a semiconductor device including a field-effect transistor having a thick insulating film in a trench of a substrate surface between a drain and a source.

To be in use for an LDMOSFET (Laterally Diffused Metal-Oxide-Semiconductor Field Effect Transistor, LDMISFET: hereafter, simply referred to as an "LDMOS"), an RESURF (REduced SURface Field) type MOS transistor is adopted as a commonly used configuration. Besides this, there is studied a configuration which alleviates a magnetic field intensity under a drain side edge of a gate electrode by forming a thick oxide film over a surface of a semiconductor substrate and arranging the drain side edge of the gate electrode over the oxide film.

For example, Patent Document 1 (Japanese Unexamined Patent Application Publication No. 2014-107302) discloses an example in which, when arranging part of a gate electrode of an LDMOS over an element isolation region having an STI (Shallow Trench Isolation) structure, an opening penetrating the gate electrode is formed in a semiconductor substrate between the element isolation region and a source region.

Patent Document

[Patent Document 1] Japanese Unexamined Patent Application Publication No. 2014-107302

SUMMARY

When the element isolation region having the STI structure is provided between a channel region and a drain region of an LDMOS, an electric field may become high in the semiconductor substrate near a corner portion of a bottom of the element isolation region on the side of the channel region. In such a case, electrons generated in the high field region are accelerated by the electric field and are poured into the gate electrode, and the problem resulting from this arises by which a gate insulation film is destroyed.

In order to cope with the above, for the purpose of preventing the electrons from being poured into the gate electrode, as described in Patent Document 1, it is conceivable to remove part of the gate electrode and form an opening. However, also in this configuration, since the electrons move along a line of electric force and are poured into the gate electrode, an insulation breakdown may happen. Therefore, the configuration which can prevent the insulation breakdown more effectively is asked for.

The other objects and novel features will be apparent from the description of the specification and accompanying drawings.

Among the embodiments disclosed in the present application, representative ones will be described briefly in the following.

As to a semiconductor device being one embodiment, in a p type LDMOS having an element isolation region of an STI structure between a source region and a drain region over an upper surface of a substrate, a gate electrode includes a silicon film over the substrate and a metal film in a trench which penetrates the silicon film.

As to a manufacturing method of a semiconductor device being another embodiment, a source region and a drain region, and an element isolation region between the source region and the drain region are formed over an upper surface of a substrate. After forming a silicon film straddling over the element isolation region and a main surface of the substrate, a metal film is embedded in a trench which penetrates the silicon film, and a gate electrode which includes the silicon film and the metal film is formed.

According to one embodiment, the reliability of the semiconductor device can be improved.

DETAILED DESCRIPTION

Figure 1:
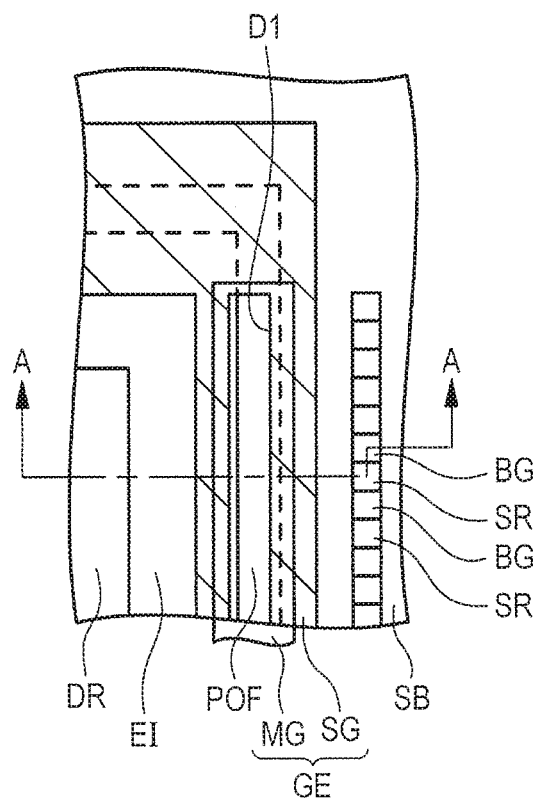
FIG. 1 is a plan view of a semiconductor device being First Embodiment of the present invention.

Now, the preferred embodiments of the present invention will be explained below in detail with reference to the accompanying drawings. Throughout the drawings for explaining the embodiment, the same reference characters designate the same or functionary equivalent components, and their explanations will not be repeated where redundant. In the description that follows, the explanations of the same or corresponding components of the embodiments will not be repeated in principle unless specifically needed. It should be noted that hatching may be used even in plan views for facility of comprehending the configuration.

Further, the codes "−" and "+" indicate relative concentrations of impurities whose conductive types are an n type or a p type. For example, as for the case of n type impurities, the impurity concentration becomes higher in the order of "n$^{−−}$", "n", and "n$^{+}$". Also, in the present application, a substrate which has an SOI (Silicon On Insulator) configuration may be called a semiconductor substrate.

First Embodiment

<Configuration of Semiconductor Device>

Figure 2:
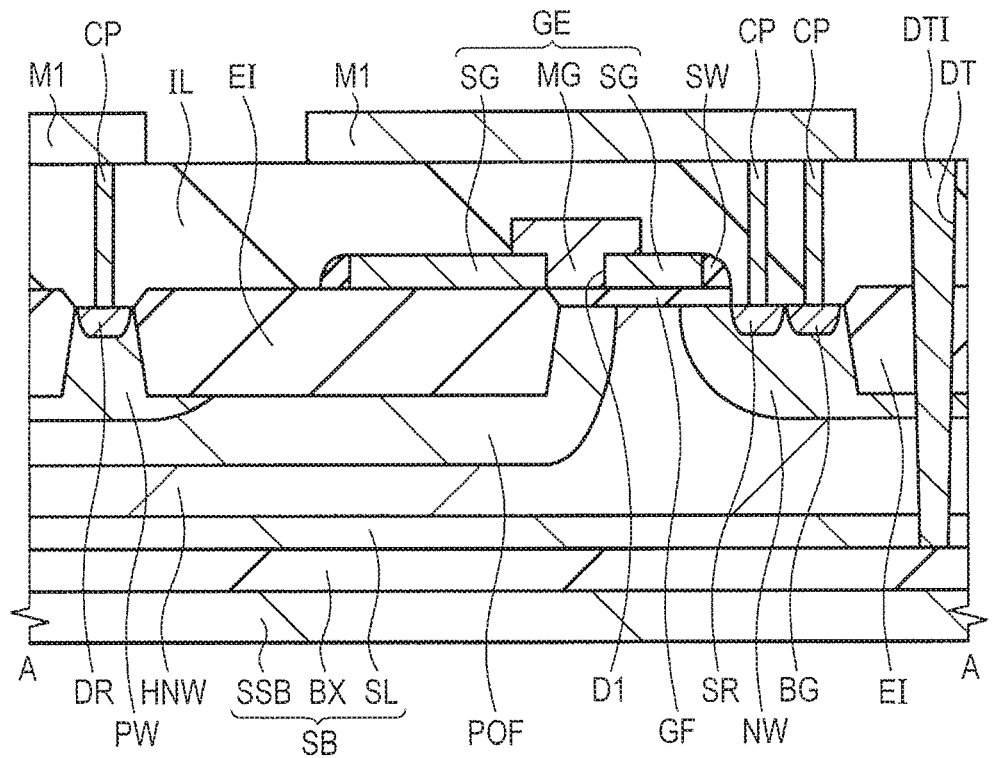
FIG. 2 is a cross-sectional view taken along line A-A of FIG. 1.

With reference to FIGS. 1 and 2, the configuration of a semiconductor device according to First Embodiment will be explained. FIG. 1 is a plan view showing the semiconductor device of the present embodiment. FIG. 2 is a cross-sectional view showing the semiconductor device of the present embodiment, and is a cross-sectional view taken along line A-A of FIG. 1. The semiconductor device of the present embodiment is the one which has a p channel type LDMOS transistor. Further, the LDMOS transistor (field-effect transistor) may also be called a lateral type power MOSFET (Metal Oxide Semiconductor Field Effect Transistor). The LDMOS concerned is a high withstand voltage MOSFET which is driven, for example, by 15 to 800V.

A semiconductor element of the present embodiment is formed, as shown in FIG. 2, over a semiconductor substrate SB which is an SOI substrate including a supporting substrate SSB, a buried oxide film BX over the supporting substrate SSB, and a semiconductor layer SL over the buried oxide film BX. In the LDMOS of the present embodiment, the semiconductor device may be directly formed over a substrate (semiconductor substrate) including a semiconductor. The supporting substrate SSB and the semiconductor layer SL include, for example, silicon. Further, the buried oxide film BX is an insulating film including, for example, a silicon oxide film, namely, a BOX (Buried Oxide) film. A film thickness of the semiconductor layer SL is, for example, 10 μm or smaller.

In FIG. 1, a contact plug, an interlayer insulating film, a sidewall, wirings, etc. are not shown. Also, an element isolation region (isolation oxide film, buried insulating film) EI near a source region SR, a DTI (Deep Trench Isolation) structure DTI, a well HNW, and a well NW (see FIG. 2) are not shown. A structure shown in FIG. 1 illustrates one-fourth of a unit of the LDMOS. Further, on the lower and left side of the structure shown in FIG. 1, a similar structure is shown by line symmetry. Also, in FIG. 1, outlines of a portion of the element isolation region EI covered with the gate electrode GE and the offset region POF are shown by broken lines, respectively.

FIGS. 1 and 2 show the LDMOS formed over the semiconductor substrate SB. As shown in FIGS. 1 and 2, the semiconductor device of the present embodiment includes the semiconductor substrate SB. Over an upper surface of the semiconductor substrate, namely, an upper surface of the semiconductor layer SL being part of the SOI substrate, there are formed a drain region DR being a p$^{+}$ type semiconductor region into which p type impurities (for example, B (boron)) are introduced and a source region SR being a p$^{+}$ type semiconductor region into which p type impurities are introduced. Over the upper surface of the semiconductor substrate SB between the source region SR and the drain region, a trench is formed in a region close to the drain region DR and the element isolation region EI is formed in the trench.

Moreover, a back gate electrode BG which is an n$^{+}$ type semiconductor region into which the n type impurities (for example, P (phosphorus) or arsenic (As)) are introduced is formed over the main surface of the semiconductor substrate SB of the region adjacent to the source region SR.

The element isolation region EI has an STI structure and, for example, includes a silicon oxide film. A cross section of the element isolation region EI has a trapezoid shape whose width of a lower surface is smaller than that of an upper surface. The element isolation region EI is so formed as to surround the drain region DR in a plan view. As shown in FIG. 2, another element isolation region EI is formed also near the source region SR and the back gate electrode BG. In addition, a "width" as used in the present application refers to a prescribed length in a direction along the main surface of the semiconductor substrate SB.

The element isolation region EI can be formed using a LOCOS (Local Oxidation of Silicon) structure which is made by oxidizing the main surface of the semiconductor substrate SB. In the present embodiment, however, the element isolation region EI of the STI structure instead of the LOCOS structure is formed. The element isolation region EI of the STI structure is deeper than the element isolation region of the LOCOS structure. Moreover, as compared to a side of the element isolation region EI of the LOCOS structure, a side of the element isolation region EI of the STI structure has an angle of inclination in almost a perpendicular direction with respect to the main surface of the semiconductor substrate SB. Therefore, a corner portion being a border part between a side surface and a bottom face of the element isolation region EI has an angle close to a right angle.

Over the main surface of the semiconductor substrate SB, the n well HNW being an n$^{−}$ type semiconductor region into which the n type impurities are introduced is formed. Also, over the main surface of the semiconductor substrate SB, the offset region POF being a p$^{−}$ type semiconductor region into which the p type impurities are introduced is formed. The offset region POF is a region in which a formation depth is shallower than the n well HNW, and a formation depth is deeper than the element isolation region EI, and it is formed over the main surface of the semiconductor substrate SB so that the bottom face and the side surface of the element isolation region EI may be covered. Furthermore, in a region of the main surface of the semiconductor substrate SB where the offset region POF is formed and, at the same time, over the main surface on the drain region DR side, a p well PW being a p type semiconductor region into which the p type impurities are introduced is formed. The p well PW has a formation depth shallower than that of the offset region POF. In addition, a "depth" as used in the present application is a length which extends downward from the main surface in a direction perpendicular to the main surface of the semiconductor substrate SB.

The drain region DR is formed in a region of the main surface of the semiconductor substrate SB where the p well PW is formed. The offset region POF is electrically coupled to the drain region DR through the p well PW. Although the offset region POF and the p well PW are formed near the drain region DR, the offset region POF and the p well PW are not formed near the source region SR. That is, the p well PW is not formed between the element isolation region EI and the source region SR between the drain regions DR and the source region SR.

The p type impurity concentration of the offset region POF is lower than p type impurity concentration of the p well PW, and p type impurity concentration of the p well PW is lower than each p type impurity concentration of the drain region DR and the source region SR. The offset region POF is a semiconductor region which is equivalent to an LDD (Lightly Doped Drain) layer provided to relax a lateral electric potential when the electric potential is supplied to the drain region DR.

As shown in FIG. 1, the offset region POF is formed over the main surface of the semiconductor substrate SB exposed from the element isolation region EI in the region surrounding the drain region DR and the element isolation region EI.

Further, in the main surface of the semiconductor substrate SB where an n well HNW shown in FIG. 2 is formed and, at the same time, a position spaced from the offset region POF, there is formed an n well NW being an n type semiconductor region into which n type impurities are introduced. The n well NW is a region in which n type impurity concentration is higher than that of the n well HNW, and its formation depth is shallow. In a region of the main surface of the semiconductor substrate SB where the n well NW is formed, the source region SR and the back gate electrode BG are arranged in a row. That is, although the n well NW is formed near the source region SR, the n well NW is not formed near the drain region DR. The back gate electrode BG is an electrode provided in order to control the voltage potential of the n well NW.

Over the main surface of the semiconductor substrate SB between the element isolation region EI and the source region SR, the gate electrode GE is formed through the gate insulating film GF. The gate insulating film GF includes, for example, a silicon oxide film, which has a thickness of 10 to 15 nm. The gate electrode GE is formed so that it may be inserted between the source region SR and the drain region DR in a plan view, and part of it has gotten immediately above the element isolation region EI.

That is, the gate electrode is so formed as to straddle over each of the element isolation region EI between the source region SR and the drain region DR as well as the main surface of the semiconductor substrate SB exposed from the element isolation region EI in a region closer to the source region SR side rather than the former element isolation region EI. Thus, the field plate effect which can relax an electric field under the element isolation region EI by allowing part of the gate electrode GE to extend over the element isolation region EI on the side of the drain region DR can be acquired. The gate electrode GE, the source region SR, and the drain region DR form an LDMOS which is a p channel type high withstand voltage MOSFET.

Although the gate insulating film GF is formed over the main surface of the semiconductor substrate SB exposed from the element isolation region EI and barely covers the upper surfaces of the element isolation region EI, the gate insulating film GF may be formed between the upper surface of the element isolation region EI and the gate electrode GE.

Here, the present embodiment is characterized in that the gate electrode GE is formed of a silicon film SG including a poly-silicon film and a metal film MG. A material for the metal film should just have good affinity with silicon and, assuming that the material would be in contact with the poly-silicon, it is preferably the one which is already in use for this purpose. Therefore, for the metal film MG, for example, the film of one of TiN (titanium nitride), W (tungsten), WSi (tungsten silicide) or Al (aluminum) can be used. This material can be suitably changed according to the temperature tolerance required, for example, of the metal film MG.

The metal film MG includes a pure metal material so formed that impurities may not be introduced. According to the present embodiment, in the silicon film SG, there is opened a trench (opening) D1 which penetrates the silicon film SG, formed having a width greater than that of the trench D1 so as to cover an upper surface of the silicon film SG. The width of the trench D1 in a direction of a gate length is 0.2 to 0.5 μm, for example.

As shown in FIG. 1, the silicon film SG, the metal film MG, and the trench D1 extend in a direction of a gate width which is orthogonal to the direction of the gate length. In FIG. 1, in order to make the drawing intelligible, hatching is given to the silicon film SG. Further, part of the metal film MG is extended downward as compared to other layouts. Each of the silicon films SG sandwiching the trench D1 is joined at the end in the direction of the gate width and is formed as one unit. That is, in the end portion of the gate width direction, namely, in the upper portion of the layout shown in FIG. 1, there is provided a termination region for relaxing the electric field. In the termination region, there is a corner portion of the element isolation region EI as seen in a plan view. In addition, in the present application, a longitudinal direction of the gate electrode GE is called the gate width direction, and a direction of a short side of the gate electrode GE is called the gate length direction.

The metal film MG and the silicon film SG are in contact with each other, and are electrically coupled. That is, when a predetermined voltage potential is supplied to the gate electrode GE, the metal film MG and the silicon film SG come to be of the same potential.

Moreover, in the gate width direction, there are arranged the source regions SR and the back gate electrodes BG alternately in line. Moreover, in a plan view, the source region SR and the drain region DR are opposed across the gate electrode GE. When the LDMOS is driven, an electric-current route is formed via a shortest distance between the source region SR and the drain region DR. With respect to the region between the source region SR and the drain region DR, the above termination region is a region located outside in the direction of the gate width.

As shown in FIG. 2, a side surface of the silicon film SG, being different from the side surface of the trench D1, is covered with a sidewall SW. A width of the sidewall SW is, for example, 60 nm or greater. The sidewall SW located on the drain region DR side is formed immediately above the element isolation region EI, and the sidewall SW located on the source region SR side is so arranged as to cover the main surface of the semiconductor substrate SB between the silicon film SG and the source region SR. In a plan view, the sidewall SW on the source region SR side and the source region SR are formed being adjacent to each other.

Over each of the semiconductor substrate SB, the element isolation region EI, a gate electrode GE, and the sidewall SW, an interlayer insulating film IL with a greater film thickness than a gate electrode GE is formed. The upper surface of the interlayer insulating film IL is made flat. The interlayer insulating film IL includes a silicon oxide film, for example. In addition, although not shown, a liner film which includes silicon nitride films may be formed as part of the interlayer insulating film IL between the silicon oxide film and the main surface of the semiconductor substrate SB.

A DTI structure DTI which includes an insulating films is so formed as to penetrate the element isolation region EI adjacent to the source region SR as well as the back gate electrode BG, the interlayer insulating film IL, and the semiconductor layer SL directly under the element isolation region EI. The DTI structure DTI includes, for example, a laminated film made by laminating a plurality of silicon oxide films having different fluidity when being formed, and is embedded in the trench DT reaching an upper surface of the buried oxide film BX from an upper surface of the interlayer insulating film IL. The DTI structure DTI serves, for example, to isolates one LDMOS from another being provided in an adjoining manner.

Moreover, over each of the upper surfaces of the source region SR, the drain region DR, and the back gate electrode BG, there is coupled a contact plug CP embedded in a contact hole which penetrates the interlayer insulating film IL. The contact plug CP is a joint portion which mainly includes, for example, a W (tungsten) film. Although not shown in FIGS. 1 and 2, the main surface of the semiconductor substrate SB exposed from the element isolation region EI, the gate electrode GE, and the sidewall SW may be covered with a silicide layer.

That is, through the silicide layer, the contact plug CP may be coupled to each of the source region SR, the drain region DR, and the back gate electrode BG. In a region which is not shown, the contact plug CP coupled to the upper surface of the gate electrode GE is formed penetrating the interlayer insulating film IL. The silicide layer includes, for example, CoSi (cobalt silicide) or NiSi (nickel silicide).

In FIG. 2, there is shown a structure of a case where contact plugs CP are formed immediately above the source region SR and the back gate electrode BG, respectively. However, a single contact plug CP may be coupled to both the source region SR and the back gate electrode BG. Moreover, it may be such that the source region SR and the back gate electrode BG are electrically coupled through the silicide layer which covers the main surface of the semiconductor substrate SB and, further, a voltage potential is supplied to the source region SR and the back gate electrode BG through the contact plug CP coupled to the silicide layer in one of the regions.

Over the interlayer insulating film IL and the contact plug CP, for example, a plurality of wirings M1 which include aluminum films are formed. The wirings M1 are coupled to the upper surface of the contact plug CP. To each electrode of the LDMOS, a voltage potential is supplied through the contact plug CP from each wiring M1.

The element isolation region EI referred to in the description of the configuration of the semiconductor device below indicates the element isolation region EI located between the source region SR and the drain region DR. Therefore, it does not indicate, for example, the element isolation region EI which isolates one LDMOS from another. Further, hereinafter, there may be a case where, of the two silicon films GS isolated by the trench D1, the one located on the source region SR side is called a "source region SR side silicon film SG" and the one located on the drain region DR side is called a "drain region DR side silicon film SG."

In the main surface of the semiconductor substrate SB, toward the source region SR from the drain region DR, there are formed the element isolation region EI, the offset region POF, the n well HNW, and the n well NW, in this order. That is, with respect to the element isolation region EI, over the main surface of the semiconductor substrate SB located on the source region SR side and adjacent to the element isolation region EI, the offset region POF is formed. Further, the n well HNW is formed in the main surface of the semiconductor substrate SB between the offset region POF of the main surface and the source region SR. Still further, in the main surface of the semiconductor substrate SB between the n well HNW of the main surface and the source region SR, the n well NW is formed.

That is, over the main surface of the semiconductor substrate SB exposed from the element isolation region EI between the element isolation region EI and the source region SR, the n type semiconductor region between the offset region POF and the source region SR is a region (channel region) where a channel is formed when a p channel type LDMOS operates.

In this regard, part of the silicon film SG located closer to the source region SR side than the trench D1 is located immediately above the offset region POF formed over the main surface of the semiconductor substrate SB. That is, the end portion of the drain region DR of the silicon film SG on the source region SR side is located immediately above the upper surface of the offset region POF exposed from the element isolation region EI, and is not spaced from the offset region POF in a plan view.

Moreover, with respect to the main surface of the semiconductor substrate SB exposed from the element isolation region EI on the side closer to the source region SR side than the element isolation region EI, the drain region DR side silicon film SG is located in the drain region DR side. Therefore, the trench D1 and the metal film MG in the trench D1 are located immediately above the offset region POF exposed from the element isolation region EI over the main surface of the semiconductor substrate SB. That is, through the gate insulating film GF, the upper surface of the offset region POF which covers a side surface of the element isolation region EI and a bottom face of the metal film MG in the trench D1 are opposed.

<Effects of Semiconductor Device>

Figure 18:
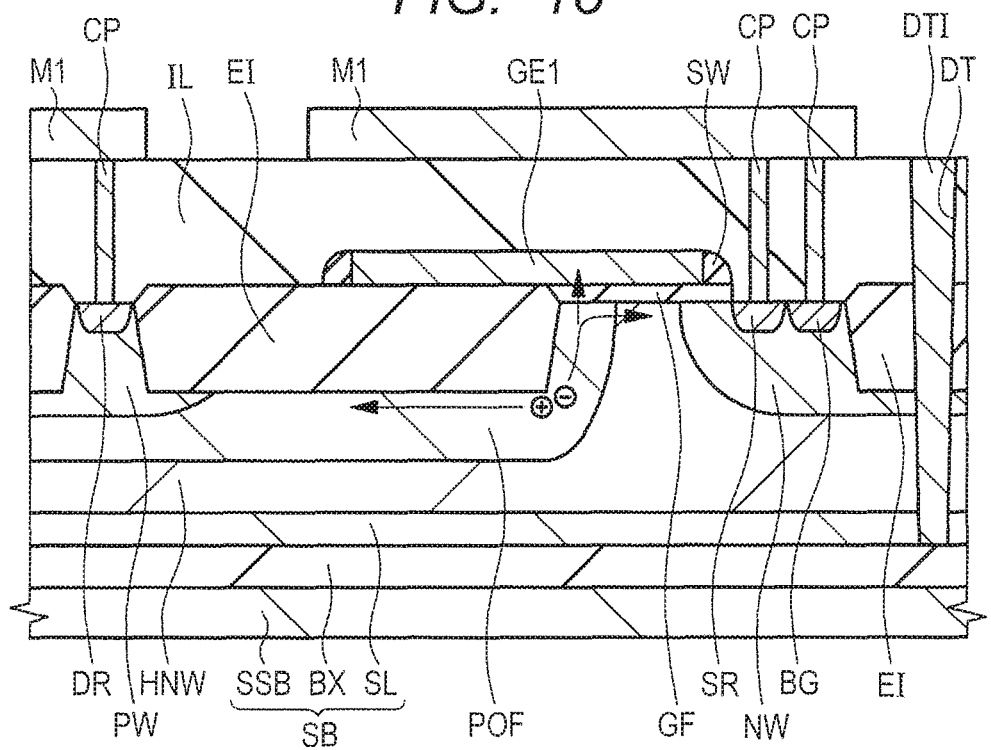
FIG. 18 is a cross-sectional view of a semiconductor device being a comparative example.
Figure 19:
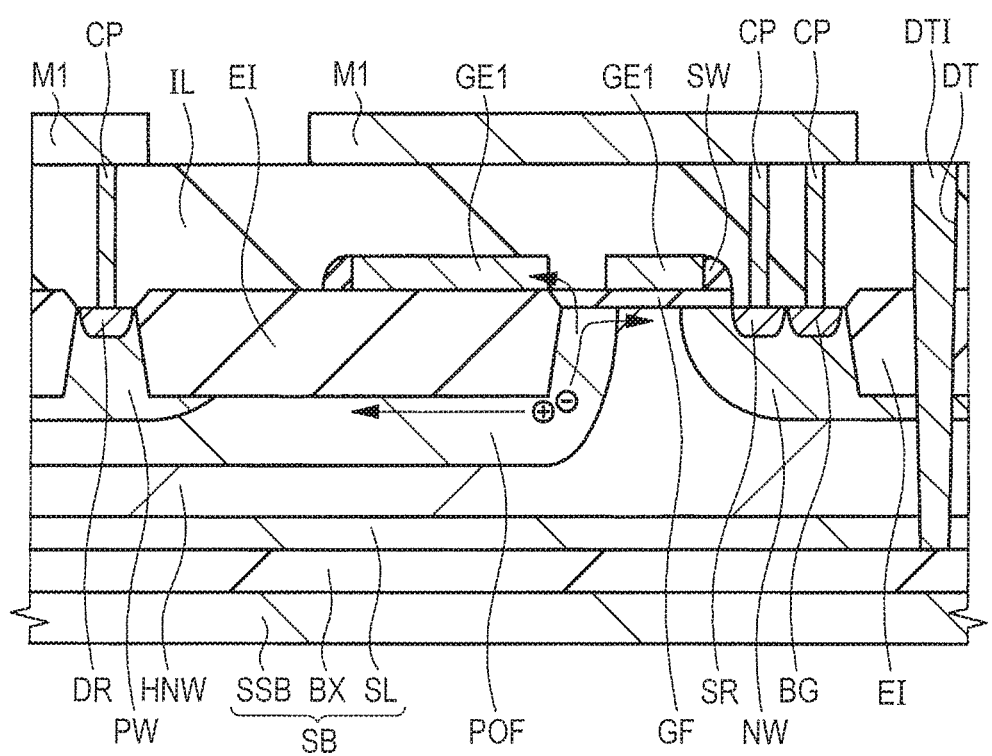
FIG. 19 is a cross-sectional view of the semiconductor device being the comparative example.

Now, with reference to a semiconductor device of the comparative example shown in FIGS. 18 and 19, effects of the configuration of the semiconductor device of the present embodiment will be explained. FIGS. 18 and 19 are cross-sectional views showing the semiconductor device being the comparative example. In addition, except for (a structure of) the gate electrode, the configuration of the LDMOS shown in FIGS. 18 and 19 is similar to that of the semiconductor device according to the present embodiment.

The LDMOS is a high withstand voltage MOS in which, for example, a voltage beyond 100V is applied to a drain electrode. In order to relax such a high voltage, in the LDMOS, as shown in FIG. 18, there is a case where the element isolation region EI is formed over an upper surface of the semiconductor substrate SB between the channel region and the drain region DR. Moreover, in order to acquire a field plate effect which can relax an electric field under the element isolation region EI here, part of the gate electrode GE1 is so formed as to be immediately above the element isolation region EI and to extend toward the drain region DR side.

In the semiconductor device of the comparative example shown in FIG. 18, the gate electrode GE1 includes a single silicon film and does not have a metal portion. Moreover, the element isolation region EI includes an insulating film embedded in the trench formed in the main surface of the semiconductor substrate SB and has an STI structure.

In this regard, as compared to the element isolation region EI having the LOCOS structure, the element isolation region EI having the STI structure has a deep formation depth. Also, an angle its sidewall forms with respect to a bottom face is close to a right angle, which intensifies an electric field at a lower end of the element isolation region EI. Therefore, in the LDMOS with the element isolation region EI having the STI structure, it is feared that the reliability may be lowered due to occurrence of hot carriers. That is, in a p channel type high withstand-voltage MOSFET, when a high voltage is applied to the drain region DR, electron-hole pairs are generated within the semiconductor substrate SB near a corner portion of the lower end of the element isolation region EI. The holes generated as above flow into the drain region DR through the inside of the offset region POF under the element isolation region EI. On the other hand, electrons generated near the corner portion head for the source region SR through the inside of the channel region of the LDMOS.

In this regard, when once passing inside of the offset region (accumulation region) POF along the side surface of the element isolation region EI, the electrons are accelerated vertically toward the main surface of the semiconductor substrate SB by the electrical field. Accordingly, some of the accelerated electrons do not head for the source region SR side but are poured into the gate insulating film GF over the main surface of the semiconductor substrate SB while retaining high energy.

When passing through the inside of the conduction band of the gate insulating film GF which is a silicon oxide film, the poured-in electrons are accelerated by an oxide-film electric field, and are poured into the poly-silicone film opposing the main surface of the semiconductor substrate SB, i.e., the gate electrode GE1. In the poly-silicon film, since the electrons poured into the gate electrode GE1 have high energy equivalent to a band offset, electron-hole pairs are generated in the poly-silicon by impact ionization.

Consequently, among the electron-hole pairs generated in the gate electrode GE1, the electrons are discharged through a contact plug (not shown) from the gate electrode GE1. However, it is thought that some holes with high energy destroy insulating films (gate insulating film GF etc.) by either of the following two mechanisms. One of the mechanisms is an AHR (Anode Hydrogen Release) mechanism in which the holes cut the hydrogen bond of the interface of the poly-silicon and an oxide film, the deviated hydrogen diffuses inside the gate insulating film GF, and causes the insulation breakdown. The other one of the mechanisms is an AHI (Anode Hole Injection) mechanism in which the holes are re-poured into the gate insulating film GF, which leads to breakdown. If the insulation breakdown arises in the gate insulating film GF etc. because of these causes, a problem of degrading the reliability of the semiconductor device will occur.

On the other hand, as in another comparative example shown in FIG. 19, it is conceivable that a gate electrode GE1 in a region which is likely to have insulation breakdown is removed and a trench is formed. However, there are following two problems related to such configurations.

The first problem arises in a case where reduction in the field plate effect is feared and when the gate electrode GE1 is partially removed in a direction of a gate width (a depth direction in the drawing) and an area where the trench is not formed is provided between the source region SR and the drain region DR. That is, in this case, there arises a difference of condensation in electric current density flowing in an accumulation region between a part where the trench is formed in the gate electrode GE1 and a part where the trench is not formed. Therefore, as compared to the case where the trench is not formed, the field plate effect by the gate electrode GE1 is not acquired uniformly and there is produced a region where the electric current density is very high. This leads to promotion of impact ionization at a lower end of the element isolation region EI locally, which may lower the reliability of the semiconductor device.

For the purpose of avoiding the above problem, in order not to produce the difference in electric current condensation, it is conceivable to remove all the gate electrodes GE1 over the accumulation region (offset region POF) in a direction of a gate width and to couple the gate electrodes GE1 without forming the trench, at only an end portion, of the LDMOS in the gate width direction. However, with such a configuration, the second problem of those described above arises. That is, electrons accelerated upward in the offset region POF immediately under the trench pass through the inside of the insulating film including the gate insulating film GF, an interlayer insulating film IL, etc. along a line of electric force. Further, the electrons flow in intensively, heading for the gate electrode GE1 via the shortest distance from a pouring position for the gate insulating film GF. That is, the electrons flow in heading for an edge portion of the gate electrode GE1 which is left without being removed. Therefore, high-density hot electrons locally flow in the gate electrode GE1, which results in unwanted speed up of the insulation breakdown.

Therefore, in the semiconductor device according to the present embodiment, as shown in FIG. 2, the poly-silicon film (silicon film SG) of the part where electrons are poured into the gate electrode GE is removed from the inside of the semiconductor substrate SB, a trench D1 is formed, and the metal film MG forming the gate electrode GE is embedded in the trench D1.

That is, in order not to allow holes of high energy, being a direct cause of insulating-film breakdown, to be generated in the gate electrode GE, the silicon film SG immediately above the main surface of the semiconductor substrate SB adjacent to the element isolation region EI is removed, and the metal film MG is formed instead. As a result, when the electrons of high energy are poured into the gate electrode GE, an LDMOS in which holes of high energy are not generated can be realized.

In other words, in the LDMOS of the present embodiment, the electron generated in the semiconductor substrate SB near the end portion (lower end) of the bottom face of the element isolation region EI are accelerated and poured into the gate insulating film GF. Then, they are poured into the metal film MG as they are. However, the pure metal film MG includes a material having no band gap. Therefore, even when the electrons are poured into the metal film MG, impact ionization does not occur inside the metal film MG. As a result, the electrons poured into the metal film MG causes the metal film MG to develop heat. However, the electrons and the heat are discharged outside through the contact plug electrically coupled to the gate electrode GE.

Thus, the insulation breakdown caused by the AHR mechanism or the AHI mechanism can be suppressed and the reliability of the semiconductor device can be improved.

In this regard, the electrons of high energy rush into the gate electrode GE via the shortest distance. Therefore, if the metal film MG is arranged immediately above the upper surface of the offset region POF adjacent to the sidewall of the element isolation region EI which is a region (accumulation region) where electrons are accelerated, it becomes possible to prevent the impact ionization which is possibly caused when the electrons are poured into the silicon film SG which forms the gate electrode GE. For this reason, the trench D1 and the metal film MG in the trench D1 need to be formed immediately above the upper surface of the offset region POF adjacent to the element isolation region EI.

According to the present embodiment, the trench D1 is formed in the silicon film SG. However, unlike the comparative example shown in FIG. 19, the metal film MG is embedded in the trench D1. Therefore, the electrons poured into the gate electrode GE from the inside of the semiconductor substrate SB rush into the metal film MG instead of the silicon film SG. Further, the electrons are discharged out of the gate electrode GE without causing impact ionization. Consequently, the electrons are not locally poured into the silicon film SG because of the formation of the trench D1. As a result, an occurrence of the insulation breakdown can be prevented.

Also, since the metal film MG having the same potential as that of the silicon film SG is embedded in the trench D1, it becomes possible to prevent a condensation difference arising in electric current density inside the semiconductor substrate SB due to formation of the trench D1. As a result, it becomes possible to acquire the field plate effect uniformly and to allow a region with high electric current density to be produced. Therefore, promotion of impact ionization near a lower end of the element isolation region EI can be prevented.

<Method of Manufacturing Semiconductor Device>

Now, with reference to FIGS. 3 to 9, a method of manufacturing a semiconductor device according to the present embodiment will be explained. FIGS. 3 to 9 are cross-sectional views showing manufacturing processes of the semiconductor device according to the present embodiment.

Figure 3:
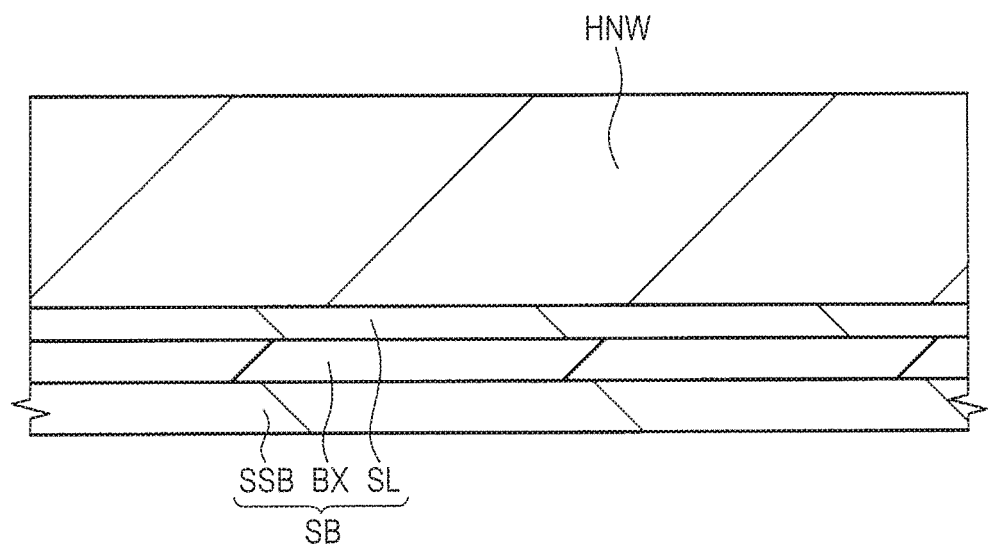
FIG. 3 is a cross-sectional view showing a manufacturing process of the semiconductor device according to First Embodiment of the present invention.

First, as shown in FIG. 3, a semiconductor substrate SB is provided. The semiconductor substrate SB includes a supporting substrate SSB, a buried oxide film BX formed over the supporting substrate SSB, and a semiconductor layer SL over the buried oxide film BX. The supporting substrate SSB and semiconductor layer SL includes single-crystal silicon (Si). The buried oxide film BX includes a silicon oxide film, and its film thickness is 50 nm.

In the present embodiment, there will be explained formation of an LDMOS over the semiconductor substrate SB which is an SOI substrate which includes the supporting substrate SSB, the buried oxide film BX, and the semiconductor layer SL. However, the semiconductor substrate SB may be a monolayer substrate which includes a single-crystal silicon layer alone which does not have the buried oxide film BX.

Subsequently, into a main surface of the semiconductor layer SL which is a main surface of the semiconductor substrate SB, by introducing n type impurities (for example, P (phosphorus) or As (arsenic)) using ion implantation, an n well HNW which is an n type semiconductor region is formed.

Figure 4:
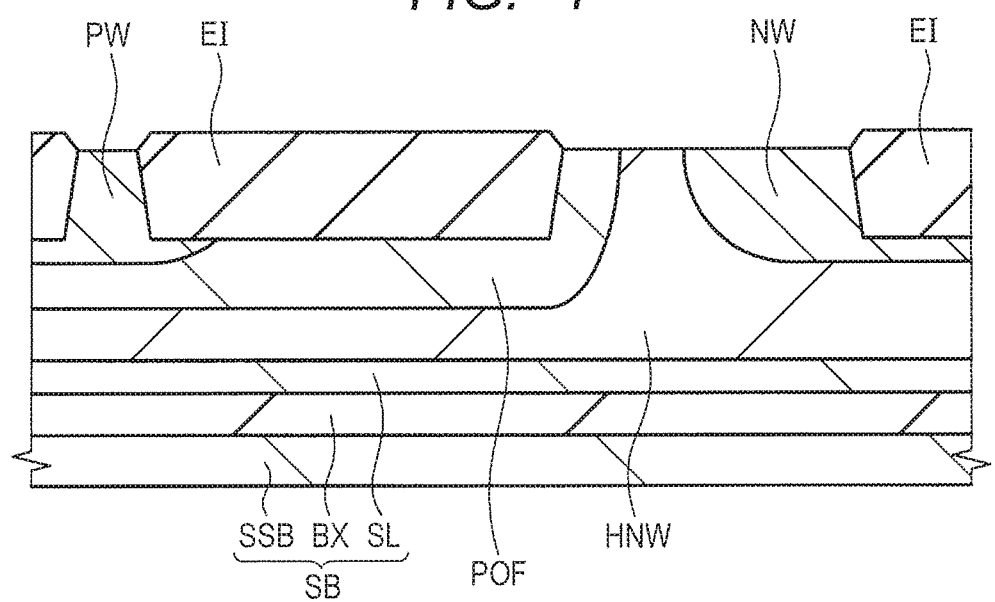
FIG. 4 is a cross-sectional view showing a manufacturing process of the semiconductor device subsequent to the manufacturing process shown in FIG. 3.

Next, as shown in FIG. 4, into an upper surface of the semiconductor layer SL, by introducing p type impurities (for example B (boron)) at relatively low concentration using ion implantation, an offset region POF which is a p type semiconductor region is formed. Further, an element isolation region EI is formed over an upper surface of the semiconductor layer SL, for example, by using the STI method. Still further, into the upper surface of the semiconductor layer SL, by introducing p type impurities (for example B (boron)) at relatively high concentration using ion implantation, a p well PW which is a p type semiconductor region is formed. Still further, into the upper surface of the semiconductor layer SL, by introducing n type impurities (for example P (phosphorus) or As (arsenic)) using ion implantation, an n well NW which is a p type semiconductor region is formed.

The offset region POF, the element isolation region EI, the p well PW, and the n well NW described above may be formed in any order. The offset region POF is formed shallower than the n well HNW. Further, the p well PW and the n well NW are formed shallower than the offset region POF. The element isolation region EI is formed shallower than either of the p well PW and the n well NW. Each of the offset region POF, the p well PW, and the n well NW is formed by ion implantation using a photo-resist film as a mask. The p well PW has impurity concentration higher than the offset region POF, and the n well NW has impurity concentration higher than the n well HNW.

In a formation process of the element isolation region EI, first, by dry-etching using a hard mask etc., an element isolation trench is formed by removing part of the upper surface of the semiconductor layer SL of a region where the element isolation region EI is formed. Then, using a CVD (Chemical Vapor Deposition) method or the like, by depositing an insulating film containing silicon oxide over the surface of the semiconductor substrate SB, the insulating film is embedded inside the element isolation trench. Subsequently, an upper surface of the insulating film is polished using, for example, a CMP (Chemical Mechanical Polishing) method to flatten the surface of the insulating film. Accordingly, by exposing the upper surface of the semiconductor layer SL beside the element isolation trench from the insulating film, there is formed the element isolation region EI including the insulating film embedded in the element isolation trench. Then, the above hard mask is removed.

Here, the offset region POF is so formed as to cover a prescribed side surface and a bottom face of the element isolation region EI, and a p well PW is formed in the upper surface of the semiconductor layer SL adjacent to one side surface of the element isolation region EI. Moreover, of upper surfaces of the semiconductor layer SL adjoining to both sidewalls of the element isolation region EI, over the upper surface where the p well PW is not formed and, at the same time, the upper surface at a position spaced from the offset region POF, the n well NW is formed. A width of the offset region POF formed over the main surface of the semiconductor substrate SB between the element isolation region EI and the n well NW and, at the same time, the smallest width between the n well NW and the p well PW is 0.2 to 0.5 μm, for example.

Figure 5:
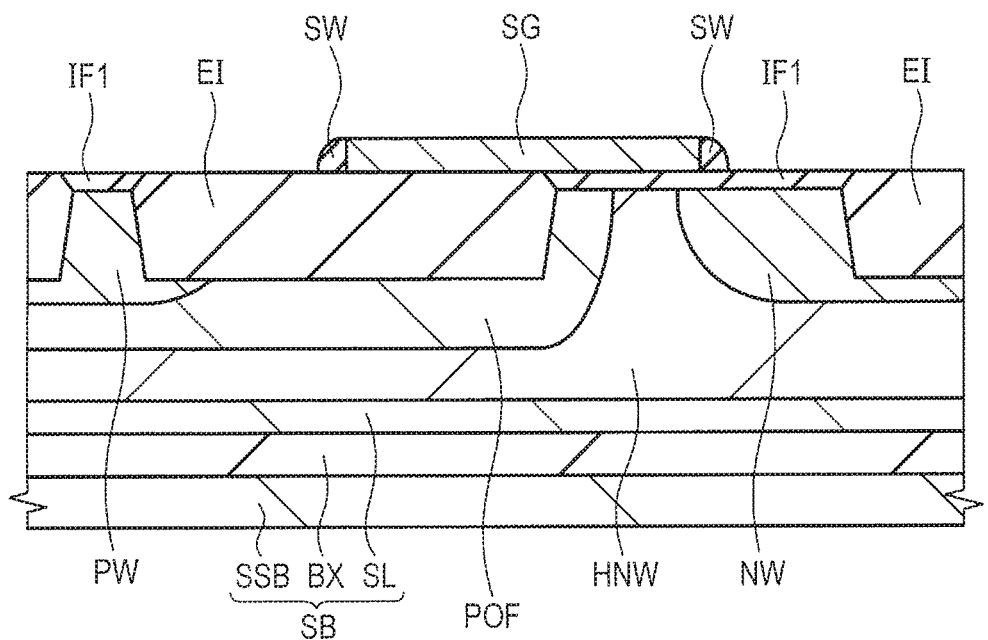
FIG. 5 is a cross-sectional view showing a manufacturing process of the semiconductor device subsequent to the manufacturing process shown in FIG. 4.

Next, as shown in FIG. 5, for example, by using a thermal oxidation method, an insulating film IF1 which covers the main surface of the semiconductor substrate SB exposed from the element isolation region EI is formed. In addition, the insulating film IF1 may be formed by depositing, using the CVD method or the like. In such a case, the insulating film IF1 is so formed over the entire main surface of the semiconductor substrate SB as to also cover an upper surface of the element isolation region EI. A film thickness of the insulating film IF1 is, for example, 10 to 15 nm.

Next, over the main surface of the semiconductor substrate SB, for example, by using the CVD method, a silicon film SG including poly-silicon is formed. Subsequently, using photolithography and dry etching techniques, the silicon film SG is processed. Consequently, the silicon film SG is so left as to straddle immediately above the element isolation region EI between the p well PW and the n well NW as well as the main surface of the semiconductor substrate SB adjacent to the element isolation region EI and located on the n well NW side. That is, the silicon film SG is so formed as to straddle immediately above the element isolation region EI and the insulating film IF1, respectively. Further, over the main surface of the semiconductor substrate SB exposed from the element isolation region EI immediately under the silicon film SG, there are formed each upper surface of the offset region POF, the n well NW, and n well HNW located between the offset region POF and the n well NW.

Next, a sidewall SW including an insulating film which covers side surfaces of both sides of the silicon film SG is formed. The insulating film has a lamination structure which includes a silicon nitride film and a silicon oxide film formed over the silicon nitride film, for example. The width of the sidewall SW is 60 nm, for example. Here, the insulating film which has a 60 nm-film thickness is formed using the CVD method etc., for example, over a main surface of the semiconductor substrate SB and the silicon film SG, respectively. Then, etch back of the insulating film is performed by a dry etching technique, and the upper surface of the silicon film SG and the main surface of the semiconductor substrate SB are exposed from the insulating film. The sidewall SW including the insulating film which is in contact with the side surface of the element isolation region EI is formed.

The sidewall SW which is in contact with one side surface of the silicon film SG is formed immediately above the element isolation region EI and the sidewall SW which is in contact with the other side surface is formed immediately above the n well NW located in the main surface of the semiconductor substrate SB.

Figure 6:
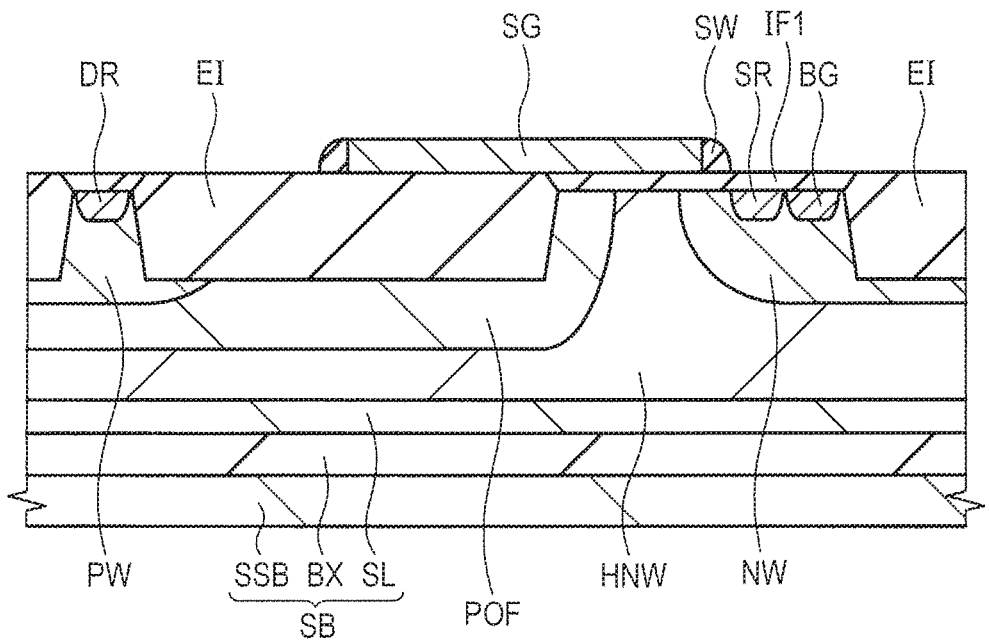
FIG. 6 is a cross-sectional view showing a manufacturing process of the semiconductor device subsequent to the manufacturing process shown in FIG. 5.

Next, as shown in FIG. 6, the source region SR, the drain region DR, and the back gate electrode BG are formed in the main surface of the semiconductor substrate SB using a photolithography technique and ion implantation. The drain region DR is formed over the upper surface of p well PW which is adjacent to the element isolation region EI. The source region SR and the back gate electrode BG are put in order and formed in the upper surface of an n well NW. Each of the source region SR and the drain region DR is formed over the main surface of the semiconductor substrate SB by implanting p type impurities (for example, B (boron)). The back gate electrode BG is formed in the main surface of the semiconductor substrate SB by implanting n type impurities (for example, P (phosphorus) or As (arsenic)).

Then, the impurities introduced into the semiconductor substrate SB or the silicon film SG etc. are activated by heat-treating the semiconductor substrate SB.

Figure 7:
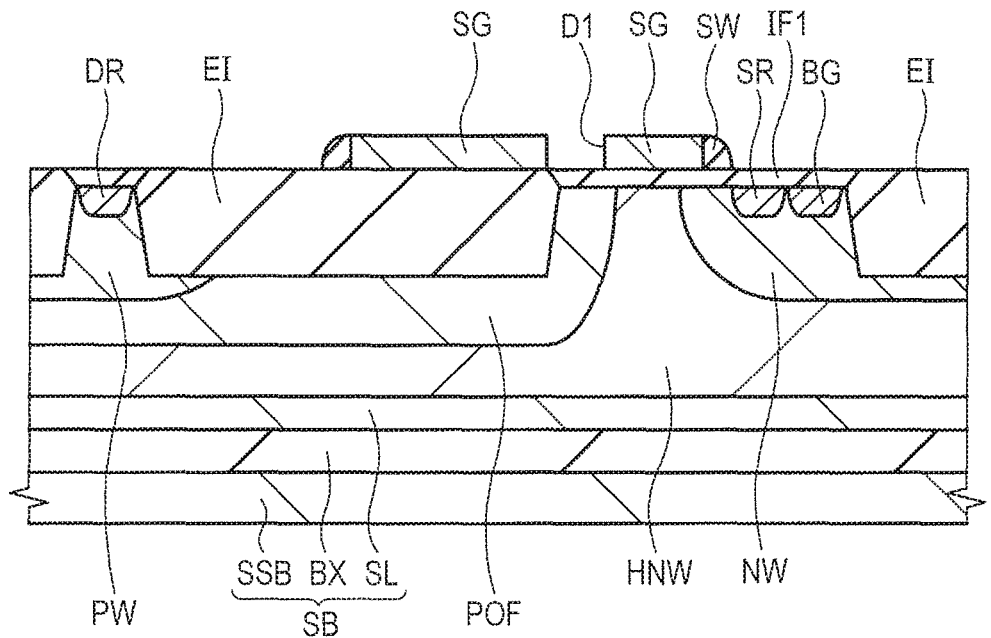
FIG. 7 is a cross-sectional view showing a manufacturing process of the semiconductor device subsequent to the manufacturing process shown in FIG. 6.

Next, as shown in FIG. 7, using photolithography and dry etching (plasma etching) techniques, the silicon film SG is processed and a trench (opening) D1 penetrating the silicon film SG is formed. At a bottom of the trench D1, an upper surface of the insulating film IF1 is exposed. The trench D1 is opened immediately above the offset region POF formed in a main surface of the semiconductor substrate SB adjacent to the element isolation region EI between the source region SR and the drain region DR and, at the same time, the main surface of the semiconductor substrate SB located on the n well NW side. A width of the trench D1 is, for example, 0.2 to 0.5 μm.

Of the silicon films SG isolated between the source region SR and the drain region DR by forming the trench D1, the silicon film SG on the drain region DR side terminates immediately above a border between an upper surface of the element isolation region EI and an upper surface of the insulating film IF1 here. However, the position of the silicon film SG on the drain region side DR terminating on the source region SR side is not limited to the above, and it may be closer to the drain region DR or closer to the source region SR. Moreover, of the terminating portions of the silicon film SG on the source region SR side, the terminating portion on the drain region DR side is located immediately above the offset region POF immediately under the trench D1.

Figure 8:
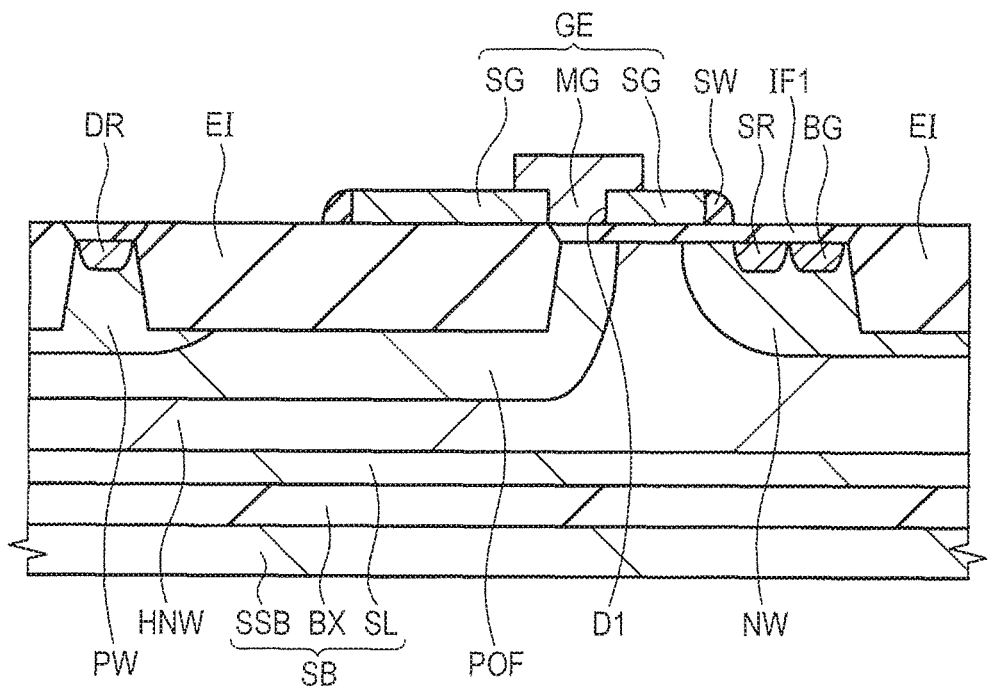
FIG. 8 is a cross-sectional view showing a manufacturing process of the semiconductor device subsequent to the manufacturing process shown in FIG. 7.

Next, as shown in FIG. 8, using a sputtering method, for example, metal films MG are formed (deposited) over the main surface of the semiconductor substrate SB and the silicon film SG. Consequently, the inside of the trench D1 is completely filled with the metal film MG, and the upper surface of the silicon film SG is covered with the metal film MG. Moreover, the metal film MG is formed directly in contact with the silicon film SG. For the metal film MG, for example, a film of either TiN (titanium nitride), W (tungsten), WSi (tungsten silicide), or Al (aluminum) can be used.

Then, except for the metal film MG inside the trench D1 and part of the metal film MG immediately above the silicon film SG, the metal films MG in other regions are removed by using photolithography and etching techniques. Thus, except for the region in which the trench D1 is formed, there are exposed from the metal film MG the sidewall SW beside the silicon film SG, the insulating film IF1, the main surface of the semiconductor substrate SB, and the element isolation region EI. Being made in this way, the metal film MG and the silicon film SG which are electrically coupled with each other form the gate electrode GE. Moreover, the gate electrode GE, the source region SR, and the drain region DR form the LDMOS.

Figure 9:
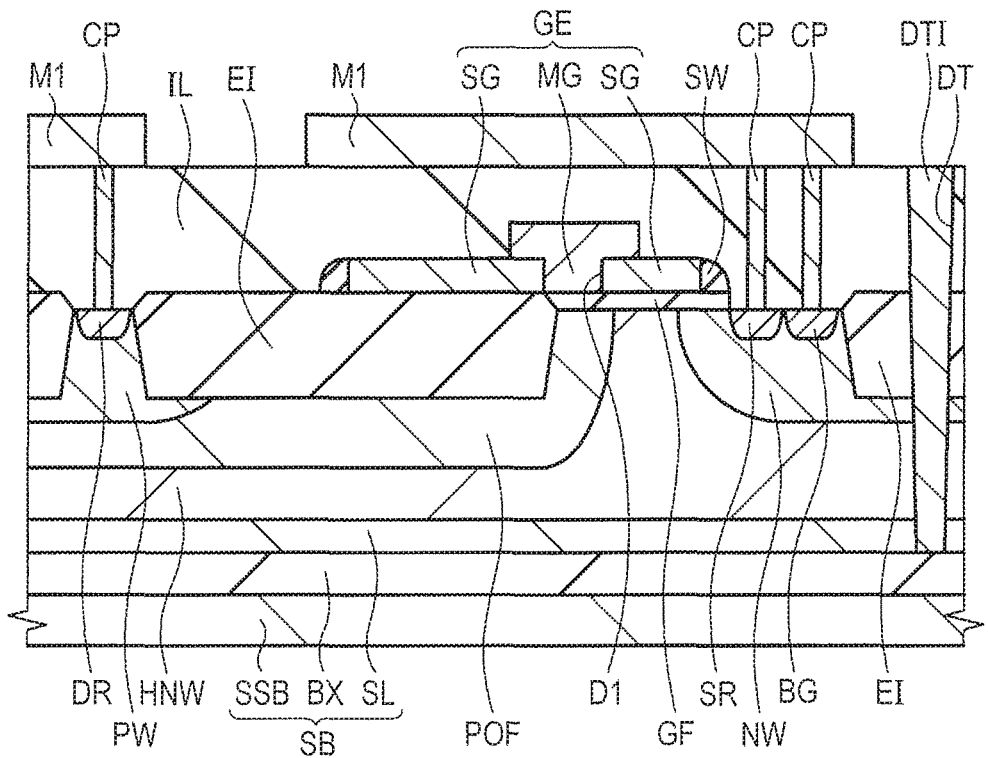
FIG. 9 is a cross-sectional view showing a manufacturing process of the semiconductor device subsequent to the manufacturing process shown in FIG. 8.

Next, as shown in FIG. 9, part of the insulating film IF1 is removed by etching using the gate electrode GE, the sidewall SW, etc. as a mask. Thus, there is formed a gate insulating film GF which includes insulating films IF1 remaining immediately under each of the metal film MG, the silicon film SG, and the Sidewall SW. Moreover, by removing part of the insulating film IF1, each of the drain region DR formed over the main surface of the semiconductor substrate SB, the source region SR, and the back gate electrode BG is exposed.

Further, after removing part of the insulating film IF1 as described above, there may be formed a silicide layer (not shown) which covers each upper surface of the drain region DR, the source region SR, and the back gate electrode BG using a known salicide (Self Aligned Silicide) process. Moreover, there may be formed a silicide layer (not shown) which covers a surface of the silicon film SG. However, as to a formation process of the silicide layer, it should be carried out in a state where a protective film which covers the metal film MG is formed so that the metal film MG may not be removed.

Next, over the main surface of the semiconductor substrate SB, for example, by sequentially forming a liner film (not shown) including, for example, a silicon nitride film and a silicon oxide film using, for example, the CVD method, an interlayer insulating film IL including a liner film and the silicon oxide film is formed. The interlayer insulating film IL is a film which is thicker than the gate electrode GE. Then, an upper surface of the interlayer insulating layer IL is flattened by polishing, for example, using the CMP method.

Then, there is formed a DTI structure DTI which isolates one LDMOS from another, or the LDMOS and other elements. In this regard, using the photolithography and dry etching techniques, there is formed a trench DT which penetrates the interlayer insulating film IL, the element isolation region EI, and the semiconductor layer SL, and to reach the upper surface of the buried oxide film BX. However, the element isolation region EI penetrated by the trench DT here is not the element isolation region EI between the source region SR and the drain region DR which forms one LDMOS.

Next, by depositing a silicon oxide film of high fluidity and high coating effect, a silicon oxide film of low fluidity and low coating effect, and a silicon oxide film of high fluidity and high coating effect, in this order, for example, using the CVD method, the trench DT is filled with a laminated film thereof. Thus, the DTI structure DTI which is comprised of the laminated film embedded in the trench DT is formed. Then, the laminated film over the interlayer insulating film IL is removed by, for example, using the CMP method. In addition, an air space may be formed inside the DTI structure DTI.

Then, a plurality of contact holes which penetrate the interlayer insulating film IL are formed using the photolithography and dry etching techniques. Accordingly, at the bottom of the contact holes, each upper surface of the source region SR, the drain region DR, and the back gate electrode BG is exposed. Moreover, the upper surface of the gate electrode GE is exposed at the bottom of the contact hole formed in the region which is not shown. In this etching step, a liner film functions as an etching stopper film.

Then, a contact plug CP which mainly includes a W (tungsten) film is formed in each contact hole. In this regard, first, by using a sputtering method etc., for example, a TiN (titanium nitride) film and the W (tungsten) film are sequentially laminated. Then, by removing the TiN (titanium nitride) film and the W (tungsten) film over the interlayer insulating film IL, for example, using the CMP method, the contact plugs CP are formed. Each of the contact plugs CP is coupled to one of the gate electrode GE, the source region SR, the drain region DR, and the back gate electrode BG.

Next, over the interlayer insulating film IL and the contact plug CP, using the sputtering method, for example, a metal film is formed. The metal film is an Al (aluminum) film, for example. Then, a plurality of wirings M1 which includes the metal film are formed by processing the metal film using the photolithography and etching techniques. The wiring M1 is electrically coupled to one of the gate electrode GE, the source region SR, the drain region DR, and the back gate electrode BG through the contact plug CP.

According to the above steps, the semiconductor device of the present embodiment having the LDMOS is substantially completed. In subsequent steps, after forming a plurality of wiring layers over the wirings M1, a plurality of semiconductor chips can be acquired by cutting the semiconductor substrate SB in a dicing process and turning it into pieces.

<Effects of Manufacturing Method of Semiconductor Device>

In the manufacturing method of the semiconductor device of the present embodiment, the same effects as the semiconductor device described above using FIG. 1 and FIG. 2 can be acquired. That is, in order not to allow holes of high energy being a direct cause of insulating-film breakdown to be generated in the gate electrode GE, the silicon film SG immediately above the main surface of the semiconductor substrate SB adjacent to the element isolation region EI is removed, and the metal film MG is formed instead. Thus, in a case where electrons of high energy are poured into the gate electrode GE, it becomes possible to realize the LDMOS in which holes of high energy are not generated. As a result, the insulation breakdown possibly caused by the AHR mechanism or the AHI mechanism can be suppressed.

Also, since the metal film MG having the same potential as the silicon film SG is embedded in the trench D1, it becomes possible to prevent a difference of condensation arising in electric current density, due to the formation of the trench D1, in the semiconductor substrate SB. As a result, it becomes possible to acquire the field plate effect uniformly and allow a region with high electric current density to be produced. Therefore, the promotion of the impact ionization near a lower end of the element isolation region EI can be prevented.

Also, in the manufacturing method of the semiconductor device according to the present embodiment, the area where the silicon film SG is replaced with the metal film MG is minimized. Therefore, as compared to a case where, for example, gate electrodes GE are all formed of metal films or a case where gate electrodes GE located closer to the drain region DR side than the silicon film SG on the source region SR side are all formed of metal films, it becomes possible to adopt a commonly used design of the LDMOS in which gate electrodes GE are all formed of silicon films. Therefore, the cost of manufacturing the semiconductor device can be reduced.

Moreover, since the side surface of the trench D1 is not covered with a sidewall, the metal film MG which has sufficient bottom surface area to capture the electrons of high energy can be formed here. That is, it becomes possible to prevent the electrons of high energy from passing through the inside of the sidewall covering the side surface of the trench D1 and being poured into the silicon film SG.

<Modification 1>

Figure 10:
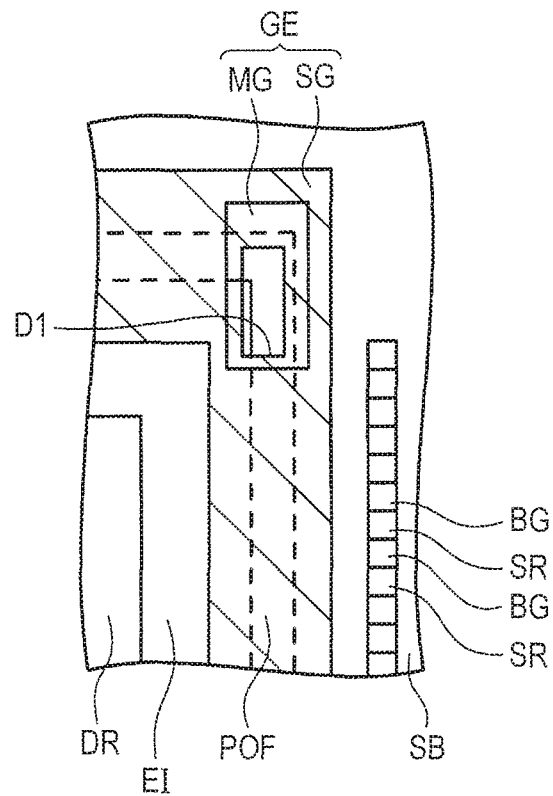
FIG. 10 is a plan view of a semiconductor device being Modification 1 of First Embodiment of the present invention.

Hereinafter, with reference to FIG. 10, there will be explained a configuration of a semiconductor device which is Modification 1 of First Embodiment. FIG. 10 is a plan view showing the semiconductor device being Modification 1 of First Embodiment.

With reference to FIG. 1, there has been explained formation of the trench D1 and the metal film MG between the source region SR and the drain region DR. In Modification 1, there will be explained forming the trench D1 and the metal film MG near a corner portion of the element isolation region EI in a plan view.

As shown in FIG. 10, the element isolation region EI immediately under the gate electrode GE has a rectangular annular structure in a plan view. FIG. 10 shows only a part containing a corner portion of the element isolation region EI which has the rectangular annular structure. In this regard, the source region SR and the drain region DR of the LDMOS are so arranged as to sandwich a predetermined side of the rectangular element isolation region EI. That is, the source region SR and the drain region DR of the LDMOS are so arranged as to sandwich an extended part of the rectangular element isolation region EI in a short-side direction of the extended part. Also, the source region SR is not formed near the extended part of the element isolation region EI and the corner portion of the element isolation region EI.

According to Modification 1, the trench D1 and the metal film MG in the trench D1 are formed immediately above the corner portion of the element isolation region EI, in a plan view, and an upper surface of the offset region POF formed over a main surface of the semiconductor substrate SB adjacent to the element isolation region EI outside the element isolation region EI, respectively.

The vicinity of a side surface of the element isolation region EI between the source region SR and the drain region DR is a region where electric current density tends to be high and is a spot where electrons of high energy are poured into the gate electrode GE caused by the high electric current density. On the other hand, the semiconductor substrate SB adjacent to the corner portion of the element isolation region EI in a plan view is a region where electric current density is lower than a region between the source region SR and the drain region DR but is a region where the electrical field is more concentrated than the region between the source region SR and the drain regions DR.

A phenomenon where electrons of high energy are poured into the gate electrode GE also occurs at a spot where the electric field is concentrated. That is, the electrical field gets greater at a lower end of the corner portion of the element isolation region EI, impact ionization occurs, and electron-hole pairs are generated. To cope with this, as in Modification 1, by forming the metal film MG immediately above the offset region POF adjacent to the element isolation region EI near the corner portion of the element isolation region in a plan view, it becomes possible to prevent insulation breakdown even when the electrons are poured into the gate electrode GE.

Incidentally, FIG. 1 shows a configuration where a metal film MG is formed between the source region SR and the drain region DR, and FIG. 10 shows a configuration where the metal film MG is formed near a corner portion of the element isolation region EI. However, metal films MG may be formed in both the areas. In this way, it becomes possible to prevent the insulation breakdown resulting from both the increase in electric field and the increase in electric current density.

<Modification 2>

Figure 11:
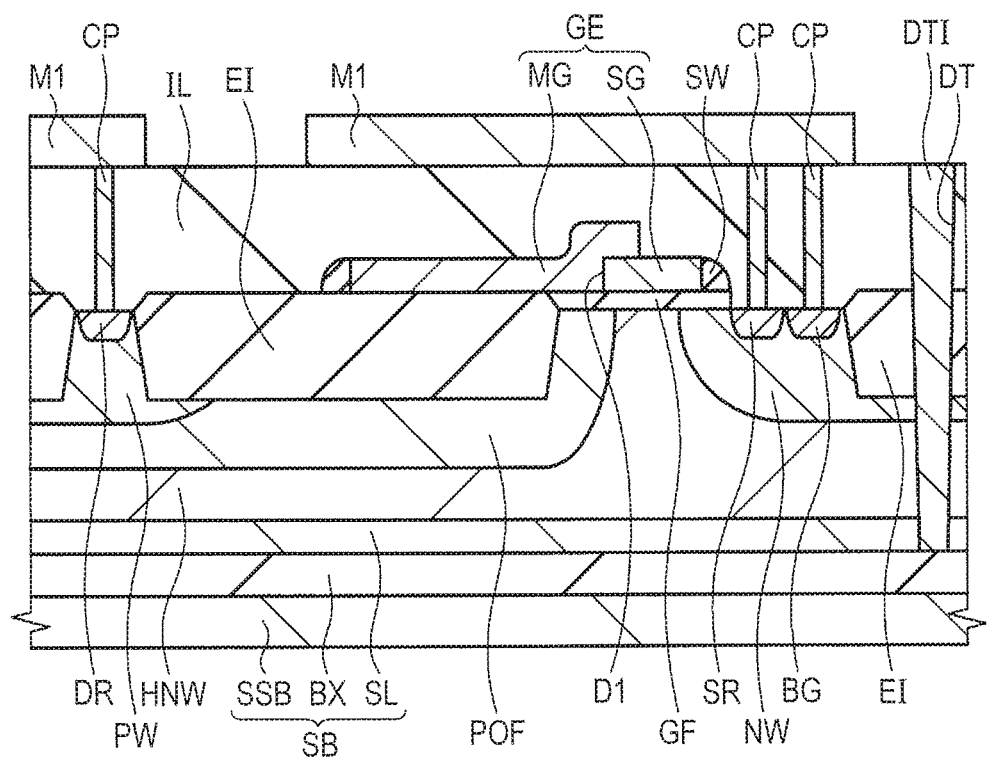
FIG. 11 is a cross-sectional view of a semiconductor device being Modification 2 according to First Embodiment of the present invention.

As in FIG. 11 which is a cross-sectional view showing Modification 2 of the semiconductor device according to First Embodiment, the gate electrode GE on the drain region DR side may be formed of the metal film MG alone, leaving the silicon film SG on the source region SR side.

That is, in this case, a trench is not formed in the silicon film SG. Alternatively, in the process as explained with use of FIG. 7, part of the silicon film SG immediately above the offset region POF adjacent to the element isolation region EI and part of the silicon film SG immediately above the element isolation region EI are removed. Then, in the process as explained using FIG. 8, by forming a metal film MG continuously covering an upper surface of the element isolation region EI and an upper surface of the offset region POF, the gate electrode GE including the metal film MG and the silicon film SG is formed. In this case, an interface between a side surface of the silicon film SG and a side surface of the metal film MG is located immediately above the upper surface of the offset region POF adjacent to the element isolation region EI.

With such a configuration also, when electrons of high energy generated near a lower end of the element isolation region EI are poured into the gate electrode GE, the electrons are poured not into the silicon film SG but into the metal film MG. Thus, it becomes possible to realize the LDMOS in which holes of high energy are not generated. As a result, since the insulation breakdown can be suppressed, the reliability of the semiconductor device can be improved.

Also, since the gate electrode GE including the metal film MG is formed over the upper surface of the offset region POF between the source region SR and the drain region DR, it becomes possible to prevent a condensation difference arising in electric current density in the semiconductor substrate SB. As a result, it becomes possible to acquire the field plate effect uniformly and to allow a region with high electric current density to be produced. Therefore, promotion of impact ionization near a lower end of the element isolation region EI can be prevented.

<Modification 3>

Figure 12:
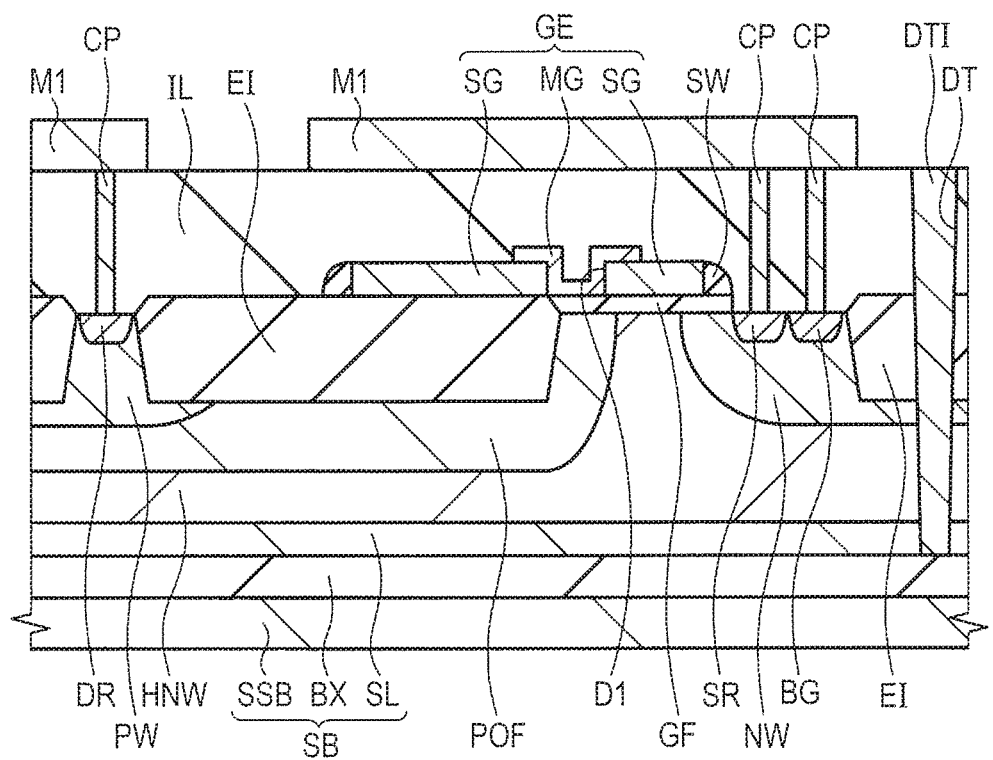
FIG. 12 is a cross-sectional view of a semiconductor device being Modification 3 of First Embodiment of the present invention.

As in FIG. 12 which is a cross-sectional view showing Modification 3 of the semiconductor device of First Embodiment, the metal film MG to be embedded in the trench D1 does not have to fill the inside of the trench D1 completely. That is, the film thickness of the metal film MG may be smaller than that of the silicon film SG, and may be smaller than one half of the width of the trench D1.

Thus, even if the thin metal film MG is formed, the same effect as the semiconductor device explained using FIG. 1 and FIG. 2 can be acquired. In addition, the metal film MG needs to have sufficient film thickness to discharge the electrons poured in from the semiconductor substrate SB side, and the heat generated when the electrons are poured in.

Second Embodiment

Figure 13:
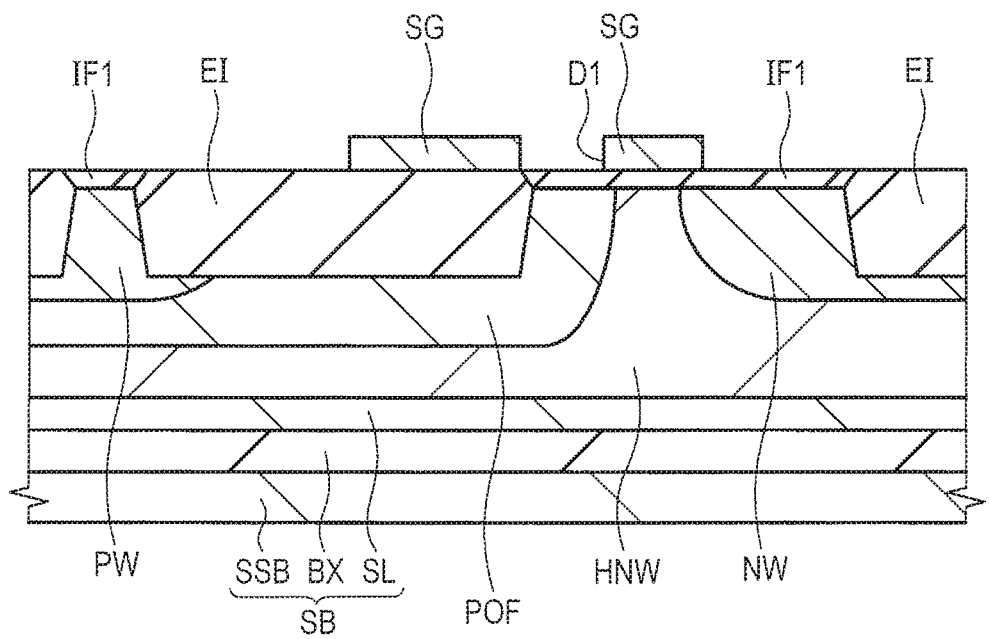
FIG. 13 is a cross-sectional view showing a manufacturing process of the semiconductor device according to Second Embodiment of the present invention.
Figure 14:
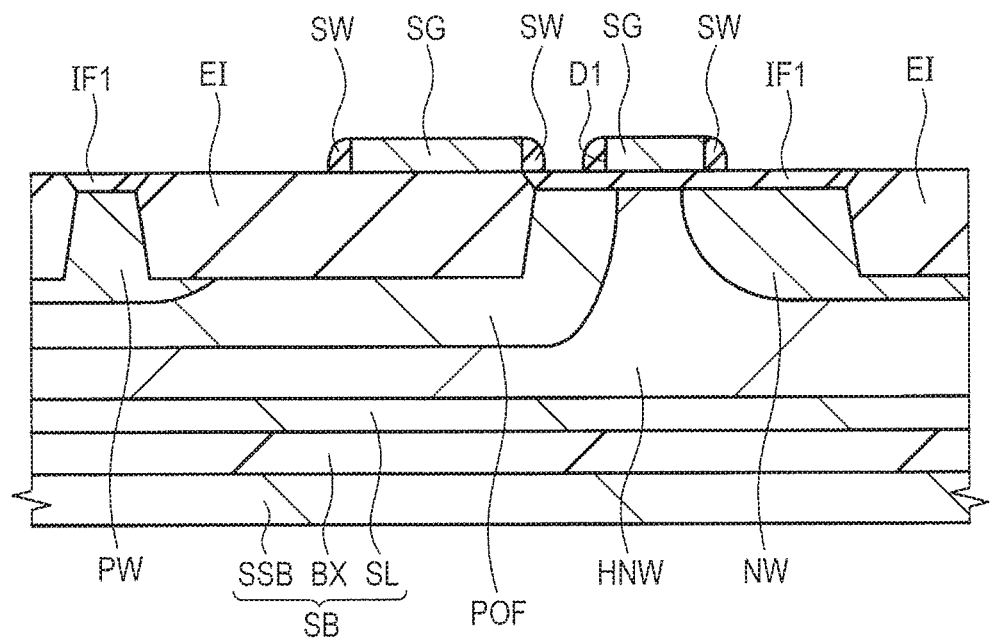
FIG. 14 is a cross-sectional view showing a manufacturing process of the semiconductor device subsequent to the manufacturing process shown in FIG. 13.
Figure 15:
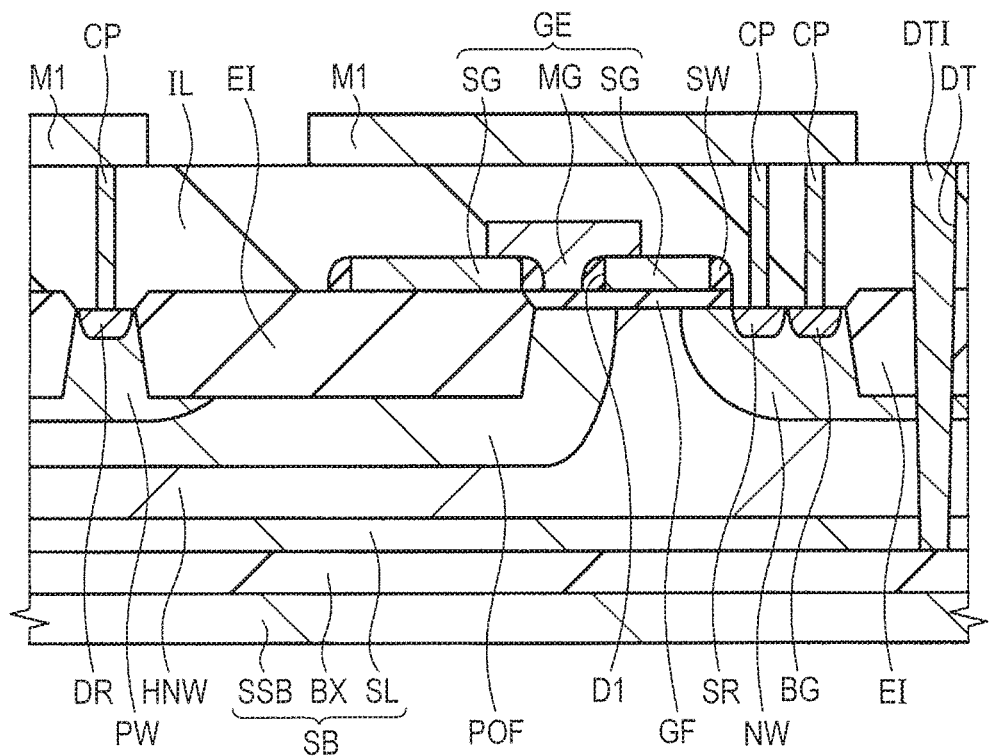
FIG. 15 is a cross-sectional view showing a manufacturing process of the semiconductor device subsequent to the manufacturing process shown in FIG. 14.

Hereinafter, with reference to FIGS. 13 to 15, there will be explained a method of manufacturing a semiconductor device and a configuration of the semiconductor device according to Second Embodiment. FIGS. 13 to 15 are cross-sectional views for explaining the method of manufacturing a semiconductor device according to Second Embodiment.

In this regard, there will be explained a case where a sidewall is formed over a side surface of the trench penetrating the silicon film forming the gate electrode of the LDMOS.

In the manufacturing process of the semiconductor device according to the present embodiment, first, steps as those explained using FIGS. 3 and 4 are taken.

Next, as shown in FIG. 13, the silicon film SG is formed. However, differing from First Embodiment, when processing the poly-silicon film formed over the whole surface of the main surface of the semiconductor substrate SB and forming the silicon film SG, the trench D1 which penetrates the silicon film SG is formed simultaneously.

Next, as shown in FIG. 14, the sidewall SW is formed in a self aligning manner in a state where the trench D1 is formed. Accordingly, in the trench D1, the sidewall SW which covers each of the side surfaces of both sides of the trench D1 is formed.

In this regard, of the two sidewalls of the opposing trenches D1, the sidewall SW which covers one side and the sidewall SW which covers the other side are not in contact but are spaced from each other. That is, the width of the trench D1 is greater than twice the width of the sidewall SW.

Next, as shown in FIG. 15, through the steps as those explained using FIGS. 8 and 9, the semiconductor device of the present embodiment is substantially completed. In this regard, the inside of the trench D1 is filled with the metal film MG and the sidewall SW. That is, the sidewall SW is interposed between the metal film MG and the silicon film SG which are in contact with an upper surface of the gate insulating film GF in the trench D1.

In the present embodiment also, the metal film MG is formed in contact with the gate insulating film GF immediately above the upper surface of the offset region POF adjacent to the element isolation region EI. Therefore, when electrons of high energy generated near the lower end of the element isolation region EI are poured into the gate electrode GE, the electrons are poured not into the silicon film SG but into the metal film MG. For this reason, an LDMOS in which holes of high energy are not generated can be realized. Therefore, since insulation breakdown can be suppressed, the reliability of the semiconductor device can be improved.

Also, since the gate electrode GE is formed over the upper surface of the offset region POF between the source region SR and the drain region DR, it becomes possible to prevent a condensation difference arising in electric current density inside the semiconductor substrate SB. As a result, it becomes possible to acquire the field plate effect uniformly and allow a region with high electric current density to be produced. Therefore, the promotion of impact ionization near a lower end of the element isolation region EI can be prevented.

Also, in the manufacturing step of the semiconductor device of the present embodiment, the processing (opening) explained using FIG. 7 can be skipped. Therefore, since the number of steps and the number of sheets of masks for processing can be decreased, the manufacturing cost of the semiconductor device can be reduced.

Further, in order to extend the dimension of the bottom of the metal film MG into which the electrons of high energy generated within the semiconductor substrate SB are poured, it is conceivable to expand the width of the trench D1. However, a terminal end of the silicon film SG on the side of the source region SR must be located immediately above the upper surface of the offset region POF. It is because, when the offset region POF and the silicon film SG on the side of the source region SR are spaced from each other in a plan view and the sidewall SW is formed immediately above the n well HNW between them, upon applying a forward bias voltage to the LDMOS and trying to send an electric current, an inversion layer is formed in the n well HNW immediately under the sidewall SW and the inversion layer serves as an electrical resistance.

Therefore, for the purpose of preventing formation of the inversion layer here, part of the silicon films SG is arranged immediately above the offset region POF formed in the main surface of the semiconductor substrate SB adjacent to the element isolation region EI. As a result, it becomes possible to prevent the resistance value of the LDMOS from getting higher.

Third Embodiment

Figure 16:
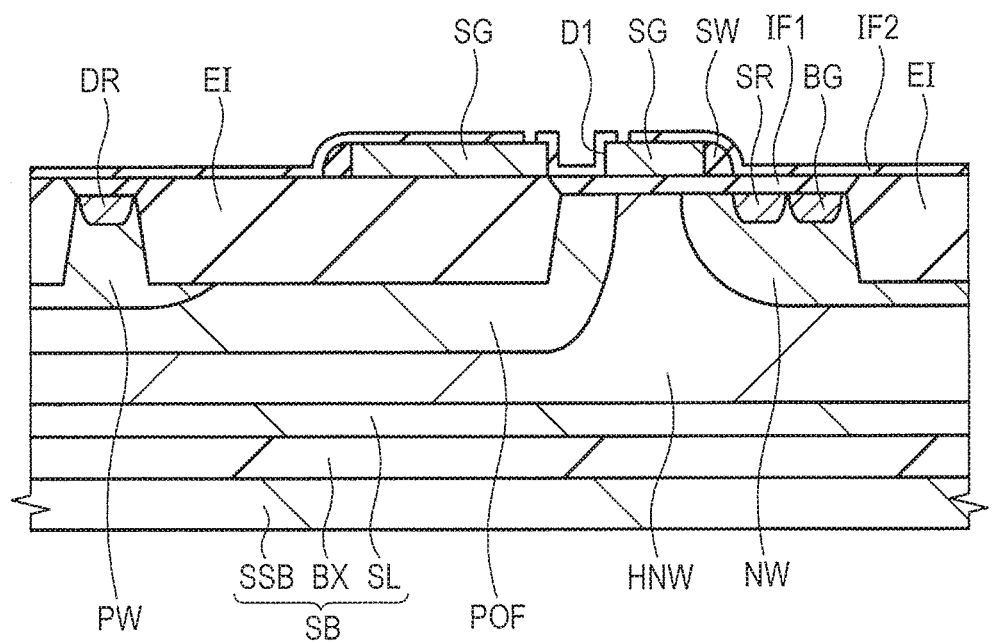
FIG. 16 is a cross-sectional view showing a manufacturing process of the semiconductor device according to Third Embodiment of the present invention.
Figure 17:
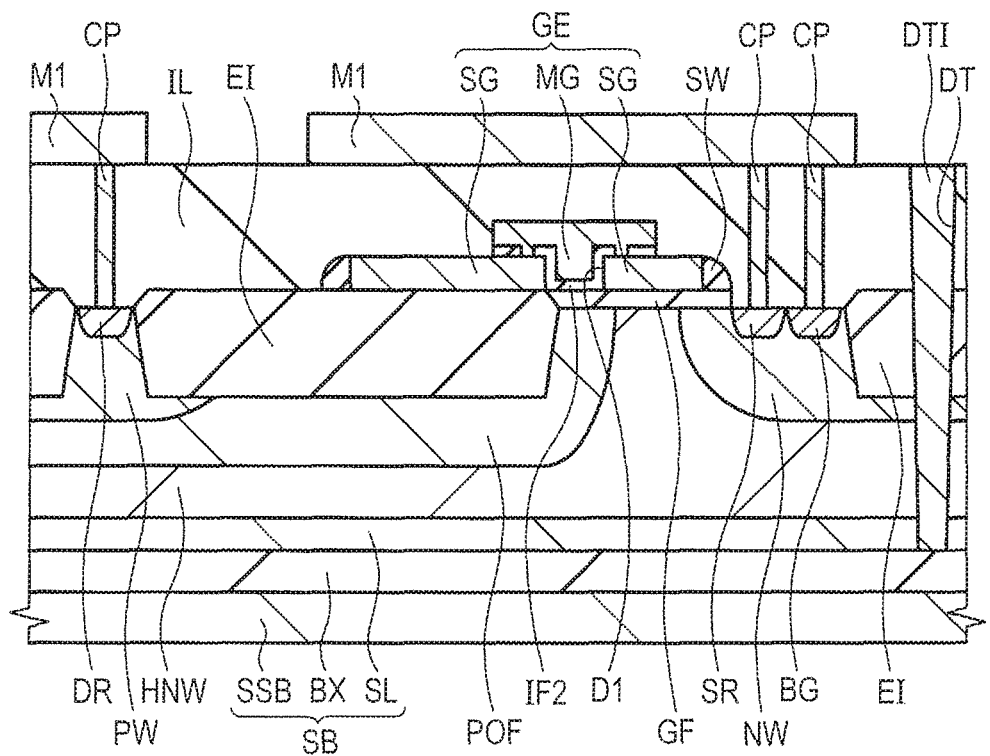
FIG. 17 is a cross-sectional view showing a manufacturing process of the semiconductor device subsequent to the manufacturing process shown in FIG. 16.

Hereinafter, with reference to FIGS. 16 and 17, there will be explained a method of manufacturing a semiconductor device and a configuration of the semiconductor device according to Third Embodiment. FIGS. 16 and 17 are cross-sectional views for explaining the method of manufacturing a semiconductor device of Third Embodiment.

In this regard, there will be explained a case where the insulating film which functions as a gate insulating film is additionally formed in the bottom of the trench which penetrates the silicon film which forms the gate electrode of the LDMOS.

In the manufacturing process of the semiconductor device according to the present embodiment, first, steps as those explained using FIGS. 3 to 7 are taken.

Next, as shown in FIG. 16, over the entire main surface of the semiconductor substrate SB, an insulating film IF2 is formed, for example, by the CVD method. The insulating film IF2 includes, for example, a silicon oxide film and its film thickness is, for example, 10 nm or less. That is, the film thickness of the insulating film IF2 is smaller than the film thickness of the insulating film IF1 which is a part of the gate insulating film to be formed later. In the trench D1, the insulating film IF2 covers an upper surface of the insulating film IF1 and a side surface of the trench D1. Moreover, the insulating film IF2 covers an upper surface of the silicon film SG, a surface of the sidewall SW, an upper surface of the element isolation region EI, an upper surface of the drain region DR, an upper surface of source region SR, and an upper surface of the back gate electrode BG.

Next, by using the photolithography and etching techniques, partial openings are formed in each of the insulating film IF2 being in contact with the upper surface of the silicon film SG on the drain region DR side and the insulating film IF2 being in contact with an upper surface of the silicon film SG on the source region SR side. In this way, the upper surfaces of both the silicon films SG beside the trench D1 are exposed.

Next, as shown in FIG. 17, through the steps as those explained using FIGS. 8 and 9, the semiconductor device of the present embodiment is substantially completed. The inside of the trench D1 of a pattern of the metal film MG formed here is filled. Further, the opening of the insulating film IF2 over the silicon film SG is also filled. That is, at a bottom of the opening, the metal film MG is electrically coupled with each of the silicon films SG on both sides of the trench D1.

In this regard, the gate insulating film of the LDMOS is formed of a laminated film including the gate insulating film GF containing the insulating film IF1 and the insulating film IF2 immediately below the metal film MG inside the trench D1. Also, in this regard, the insulating film IF2 which is not covered with the metal film MG is removed. However, the insulating film IF2 in a region which does not overlap the metal film MG in a plan view may not be removed.

According to the present embodiment, the insulating film IF2 is formed for the purpose of protecting the gate insulating film GF damaged in the step of forming the trench D1. That is, in the dry etching (plasma etching) for forming the trench D1, the insulating film IF1 (see FIG. 7) exposed to the etching is damaged. Therefore, when the metal film MG is directly formed over the insulating film IF1, the insulation breakdown may be caused due to the damage.

Therefore, according to the present embodiment, after the formation of the trench D1, as shown in FIG. 16, an upper surface of the insulating film IF1 is covered with the insulating film IF2 so that the gate insulating film GF shown in FIG. 17 may be reinforced. In this way, it becomes possible to prevent the insulation breakdown of the gate insulating film. Moreover, according to the present embodiment, the same effect as First Embodiment can be acquired.

However, in a case where the insulating film IF2 is too thick, when the side surface of the trench D1 is covered with the insulating film IF2, the metal film MG and the silicon film SG in the trench D1 are spaced greatly from each other. As a result, it may be feared that electrons of high energy passing the gate insulating film GF from the semiconductor substrate SB side are poured into the silicon film SG via the insulating film IF2 covering the side surface of the trench D1 and cause impact ionization. Therefore, the insulating film IF2 should be so formed as to have a sufficiently thin film thickness.

According to the present embodiment, by forming the insulating film IF2 thinner than the gate insulating film GF, the electrons of high energy are prevented from being poured into the silicon film SG as above. Therefore, occurrence of the insulation breakdown can be prevented and the reliability of the semiconductor device can be improved.

Although the present invention made by the inventors has been specifically explained based on the embodiments, it is to be understood that the invention is not limited to the specific embodiment described above and widely different embodiments of the invention can be made without departing from the spirit and scope thereof.

What is claimed is:

1. A semiconductor device, comprising:
   a semiconductor substrate;
   a source region and a drain region being formed over an upper surface of the semiconductor substrate and each being of p conductive type;
   a gate electrode formed over the semiconductor substrate between the source region and the drain region through a gate insulating film; and
   a first insulating film embedded in a trench formed, in a gate-length direction of the gate electrode, over the upper surface of the semiconductor substrate between the gate insulating film and the drain region, wherein part of the gate electrode is formed immediately above the first insulating film, and wherein the gate electrode includes:
      a semiconductor film; and
      a metal film which is embedded in a second trench penetrating the semiconductor film immediately above the upper surface of the semiconductor substrate between the first insulating film and the source region and is electrically coupled to the semiconductor film.

2. The semiconductor device according to claim 1, wherein part of the metal film in the second trench is located immediately above the first insulating film.

3. The semiconductor device according to claim 1, wherein a sidewall is formed which includes a second insulating film for covering a side surface of the second trench.

4. The semiconductor device according to claim 1, wherein a third insulating film is interposed between the metal film and the gate insulating film in the second trench.

5. The semiconductor device according to claim 4, wherein the third insulating film covers a bottom face and a side surface of the second trench and its film thickness is smaller than that of the gate insulating film.

6. The semiconductor device according to claim 1, further including a first p type semiconductor region electrically coupled to the drain region and formed ranging from a bottom face of the first trench over the upper surface of the semiconductor substrate closer to the source region side than the first trench,
   wherein p type impurity concentration of the first p type semiconductor region is lower than p type impurity concentration of the drain region, and
   wherein the second trench is formed immediately above an upper surface of the first p type semiconductor region adjacent to the first insulating film.

7. The semiconductor device according to claim 6,
   wherein the drain region and the first p type semiconductor region are electrically coupled through a second p type semiconductor region formed in the semiconductor substrate, and
   wherein p type impurity concentration of the second p type semiconductor region is lower than p type impurity concentration of the drain region and higher than p type impurity concentration of the first p type semiconductor region.

8. The semiconductor device according to claim 3 further including a first p type semiconductor region electrically coupled to the drain region and formed ranging from a bottom face of the first trench over the upper surface of the semiconductor substrate closer to the source region side than the first trench side,
   wherein p type impurity concentration of the first p type semiconductor region is lower than p type impurity concentration of the drain region, and
   wherein part of the semiconductor film located closer to the source region side than the metal film is located immediately above the first p type semiconductor region.

9. The semiconductor device according to claim 1, wherein the first insulating film has an STI structure.

10. A semiconductor device, comprising:
    a semiconductor substrate;
    a source region and a drain region being formed over an upper surface of the semiconductor substrate and each being of p conductive type;
    a gate electrode formed over the semiconductor substrate between the source region and the drain region through a gate insulating film; and
    a first insulating film embedded in a trench formed over the upper surface of the semiconductor substrate between the gate insulating film and the drain region in a gate-length direction of the gate electrode, wherein part of the gate electrode is formed immediately above the first insulating film, and wherein the gate electrode includes:
       a metal film embedded in a second trench that is located immediately above the upper surface of the semiconductor substrate between the first insulating film and the source region; and
       a semiconductor film electrically coupled to the metal film and located between the metal film and the source region in the gate-length direction.

11. A method of manufacturing a semiconductor device, comprising the steps of:
    (a) providing a semiconductor substrate;
    (b) forming a source region of p conductive type and a drain region of p conductive type over an upper surface of the semiconductor substrate;
    (c) forming a first trench in the upper surface of the semiconductor substrate and forming a first insulating film embedded in the first trench;
    (d) forming a gate insulating film covering the upper surface of the semiconductor substrate between the first insulating film and the source region;
    (e) after the step (d), forming a semiconductor film immediately above the first insulating film between the source region and the drain region and immediately above the upper surface of the semiconductor substrate between the first insulating film and the source region;
    (f) exposing the upper surface of the semiconductor substrate between the first insulating film and the source region from the semiconductor film by forming a second trench penetrating the semiconductor film; and (g) forming a gate electrode including a metal film and the semiconductor film by forming the metal film filling the second trench, wherein the gate electrode, the source region, and the drain region form a field-effect transistor.

12. The method of manufacturing a semiconductor device according to claim 11, further comprising a step of:

(f1) after the step (f) but before the step (g), forming a sidewall including a second insulating film covering a side surface of the second trench.

13. The method of manufacturing a semiconductor device according to claim 11, further comprising a step of:

(f2) after the step (f) but before the step (g), forming a third insulating film covering a bottom face of the second trench.

14. The method of manufacturing a semiconductor device according to claim 13, wherein the third insulating film covers a bottom face and a side surface of the second trench and its film thickness is smaller than that of the gate insulating film.

15. The method of manufacturing a semiconductor device according to claim 11, further comprising a step of:

(a1) after the step (a) but before the step (d), forming a p type semiconductor region over an upper surface of the semiconductor substrate, wherein, after the step (f), the p type semiconductor region is formed from a bottom face of the first trench over the upper surface of the semiconductor substrate closer to the source region side than the first trench, wherein p type impurity concentration of the p type semiconductor region is lower than p type impurity concentration of the drain region, and wherein the second trench is formed immediately above an upper surface of the p type semiconductor region.

* * * * *